(12) United States Patent
Hoshi et al.

(10) Patent No.: US 7,586,202 B2
(45) Date of Patent: Sep. 8, 2009

(54) ALIGNMENT SENSING METHOD FOR SEMICONDUCTOR DEVICE

(75) Inventors: Kenji Hoshi, Kawasaki (JP); Hiroshi Nomura, Kawasaki (JP); Shigeru Ishibashi, Yokohama (JP); Yi-Yu Shi, Hsinchu (TW)

(73) Assignee: Fujitsu Microelectronics Limited, Tokyo (JP)

( * ) Notice: Subject to any disclaimer, the term of this patent is extended or adjusted under 35 U.S.C. 154(b) by 341 days.

(21) Appl. No.: 10/073,314

(22) Filed: Feb. 13, 2002

(65) Prior Publication Data

US 2002/0180067 A1 Dec. 5, 2002

(30) Foreign Application Priority Data

May 30, 2001 (JP) ............................... 2001-162788

(51) Int. Cl.
*H01L 23/544* (2006.01)
(52) U.S. Cl. .................. 257/797; 257/E23.179
(58) Field of Classification Search ................. 257/797, 257/622, E23.179
See application file for complete search history.

(56) References Cited

U.S. PATENT DOCUMENTS 5,874,756 A * 2/1999 Ema et al. ................... 257/296
6,037,671 A * 3/2000 Kepler et al. ................. 257/797
6,162,675 A * 12/2000 Hwang et al. ................ 438/241
6,624,524 B1 * 9/2003 Madurawe .................... 257/797
7,068,833 B1 * 6/2006 Ghinovker et al. ............. 382/144
2001/0019401 A1 * 9/2001 Irie et al. ........................ 355/53
2002/0098707 A1 * 7/2002 Ning ........................... 438/712

FOREIGN PATENT DOCUMENTS

JP 09-102457 A 4/1997
JP 2001-93820 A 4/2001

OTHER PUBLICATIONS

Japanese Office Action dated Jun. 27, 2006 (mailing date), issued corresponding to Japanese Patent Application No. 2001-162788.

* cited by examiner

*Primary Examiner*—Bradley K Smith
*Assistant Examiner*—Amar Movva
(74) *Attorney, Agent, or Firm*—Westerman, Hattori, Daniels & Adrian, LLP.

(57) ABSTRACT

Strip-shaped alignment marks 14 are juxtaposed with each other in a silicon oxide film 12 formed on a silicon wafer 10. Each alignment mark 14 comprises a plurality of grooves 16 formed side by side in the silicon oxide film 12. An amorphous silicon film 18 is buried in the grooves 16. Thus, the alignment marks 14 are formed in a thus-formed line-and-space pattern. Accordingly, waveforms of detected signals having high contrast and little deformation can be obtained, and alignment of wafers with high accuracy can be realized.

2 Claims, 9 Drawing Sheets

ALIGNMENT SENSING METHOD FOR SEMICONDUCTOR DEVICE

BACKGROUND OF THE INVENTION

The present invention relates to a semiconductor device having alignment marks to be used in aligning the semiconductor device by an aligner.

A process for fabricating a semiconductor device includes a lithography step of forming a device pattern on a wafer, as of silicon or others.

In the lithography step, first, a resist is applied by a spin coater or others to a conducting layer or an insulation film laid on a wafer. Then, a mask having dimensions or a layout of a device drawn on is exposed by an aligner, such as a stepper, a scanner or others, in alignment with a prescribed position. Thus, the pattern of the mask is transferred to the resist film. Accuracy of the alignment of the wafer in the transfer by exposing the device pattern is an important element on which production yields of products depend on.

As a method for aligning a wafer in an aligner, FIA (Field Image Alignment), for example is known. An alignment sensor of FIA method comprises a light source for applying illumination to alignment marks formed on a wafer, an image forming optical system for condensing reflected light and diffracted light on the alignment marks to form images of the alignment marks on CCD (Charge Coupled Device) camera, a CCD camera for outputting FIA signals, which is image signals, from the image formed by the image forming system, and a signal processing unit for processing the FIA signals to obtain alignment information of the alignment marks on the wafer.

Figure 9A:
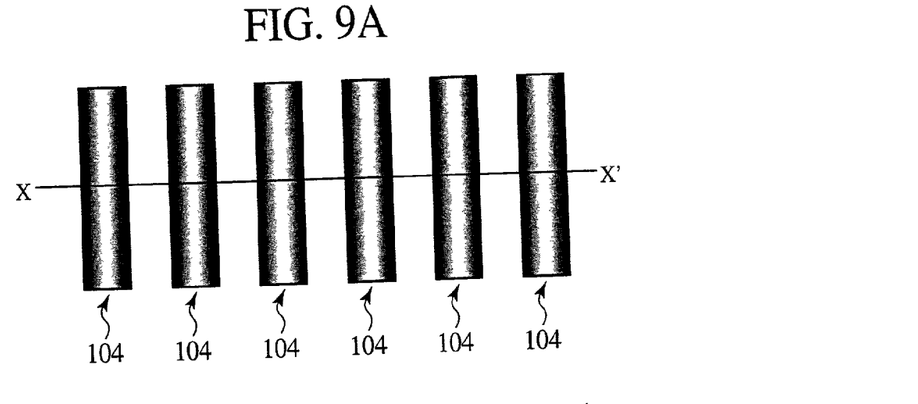
FIGS. 9A and 9B are diagrammatic views of the conventional alignment marks, which shows the structure thereof.
Figure 9B:
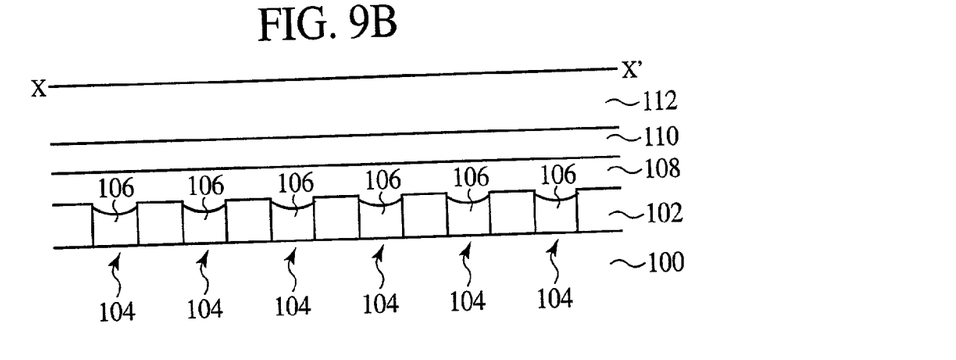

The conventional standard alignment marks used in the wafer alignment by FIA method will be explained with reference to FIGS. 9A and 9B. FIG. 9A is a top view of the alignment marks, which shows a shape of the alignment marks. FIG. 9B is sectional view of the alignment mark along the line X-X' in FIG. 9A.

As shown in FIGS. 9A and 9B, alignment marks 104 each of which is, e.g., a rectangular grooves of a 6 µm width and a 70 µm length are formed at a 12 µm pitch side by side in a 250 nm thickness silicon oxide film 102 formed on a silicon wafer 100. An amorphous silicon film 106 is filled in the alignment marks 104. Such alignment marks 104 are formed on a scribe line, which is outside an element region formed on a wafer.

As exemplified in FIG. 9B, a 200 µm thickness silicon oxide film 108 is formed on the upper surface of the above-described structure in a later fabrication step of the semiconductor device. Further on the silicon oxide film 108, BARC (Bottom Anti-Reflection Coating) 110, such as AR5 (Tradename, by Shipley Corporation) or others, is formed in a 95 nm thickness, and a resist film 112 is formed onto the BARC in a 470 nm thickness.

In the alignment of a wafer by FIA optical system, illumination light of a wide-zone wavelength from the light source of the alignment sensor is applied vertically to the alignment marks. Then, reflected light and diffracted light on the alignment marks is captured through the image forming optical system to form the images of the alignment marks on the imaging screen of the CCD camera. FIA signals provided by the CCD camera are processed to sense alignment of the alignment marks on the wafer. Based on thus sensed alignment information, the wafer is aligned.

However, in using the alignment marks shown in FIG. 9A in a fabrication process for a highly integrated semiconductor device of the new era, e.g., 0.13 µm rule DRAM (Dynamic Random Access Memory), the possibility of occurrence of dishing effect in the alignment marks during the CMP (Chemical Mechanical Polishing) process is high. That is, a size of the alignment marks is too large in comparison with a size of the cell pattern, which hinders the upper surface of the region for the alignment marks formed in from being evenly polished, with a result that the region is often unevenly polished into a hollow like a dish.

In the step of forming a metal film by sputtering, the metal film is often unsymmetrically formed on both sides of the edges of the alignment marks.

In a case that a shape of alignment marks is deformed unsymmetrical through the above-described CMP step and the metal film forming step, a central position of the alignment marks cannot be sensed, and a metering error that caused an actual position is erroneously recognized takes place. Such error is called a WIS (Wafer Induced Shift) and is a factor for causing accuracy decrease of alignment of FIA.

A contrast of alignment marks are often changed due to multiple reflection effect of illumination applied by the light source of an alignment sensor, depending on a film structure of a device formed on a wafer, and FIA signals often have a waveform largely changed. Especially, when the edges of alignment marks are sharp, large contrast differences often take place between the edges of the alignment marks and inside the edges. Then, waveforms of FIA signals are changed to have the edges alone of the alignment marks emphasized.

Figure 9C:
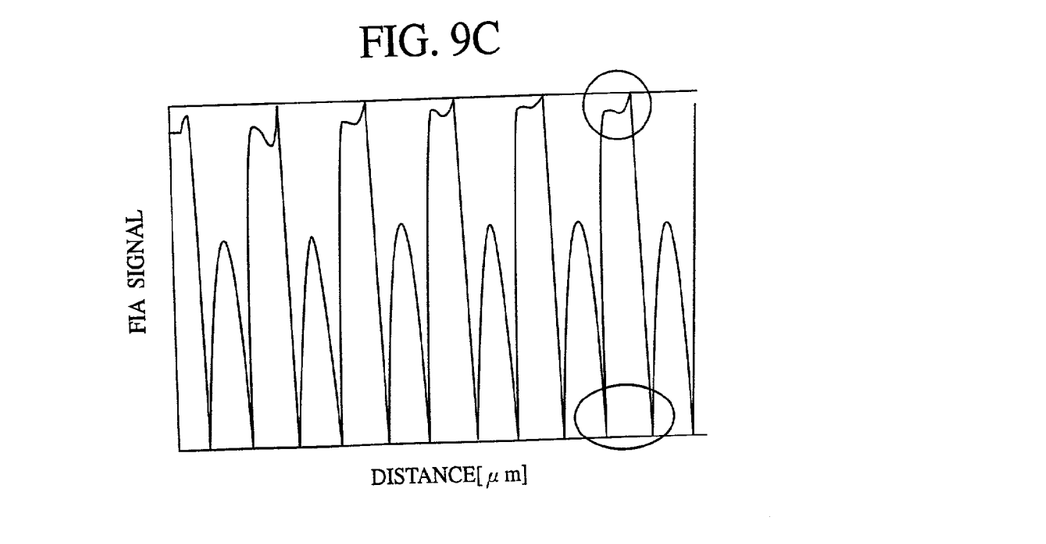
FIG. 9C is a graph of waveforms of FIA signals obtained when the conventional alignment marks shown in FIGS. 9A and 9B are used.

FIG. 9C is a graph of waveforms of FIA signals obtained when the conventional alignment marks 104 shown in FIGS. 9A and 9B are used. As circled in the graph, double edges having the edges alone of the alignment marks 104 emphasized are produced. As a result, the waveforms of the FIA signals become multiplied frequencies having a number of peaks which is twice a number of the alignment marks.

When the waveforms of the FIA signals are changed as shown in FIG. 9C, the FIA signals have different intensities between both edges of the alignment marks, or the waveforms of the FIA signals tend to be deformed. WISs tend to occur.

Central positions of alignment marks cannot be often correctly sensed due to aberrations of the image forming optical system of the alignment sensor. Such errors in sensing central positions of alignment marks are known as TIS (Tool Induced Shift). It is considered that the TIS caused by the alignment sensor itself works with the WIS synergistically to cause large metering errors and further to lower the alignment accuracy.

SUMMARY OF THE INVENTION

An object of the present invention is to provide a semiconductor device and an alignment sensing method for the semiconductor device which can provide waveforms of detected signals having high contrast and little deformation, and can realize alignment of wafers with high accuracy.

The above-described object is achieved by a semiconductor device comprising a plurality of alignment marks formed over a semiconductor wafer, each of the alignment marks being divided by a micronized pattern.

The above-described object is achieved by an alignment sensing method for a semiconductor device, in which illumination is applied to alignment marks formed on a semiconductor wafer with a device pattern, reflected light or diffracted light of the illumination on the alignment marks is formed into images, and based on image signals obtained by processing the formed images, alignment of the device pattern is sensed, each of the alignment marks being divided by a micronized pattern, and a resolution for forming images of the reflected light or the diffracted light of the illumination on the alignment marks being made capable of discriminating the alignment marks but incapable of discriminating the micronized pattern.

As described above, according to the present invention, a plurality of alignment marks formed on a semiconductor wafer are respectively divided by micronized patterns, whereby waveforms of detected signals having high contrast and little deformation can be obtained, and alignment of wafers with high accuracy can be realized.

DETAILED DESCRIPTION OF THE INVENTION

A First Embodiment

Figure 1A:
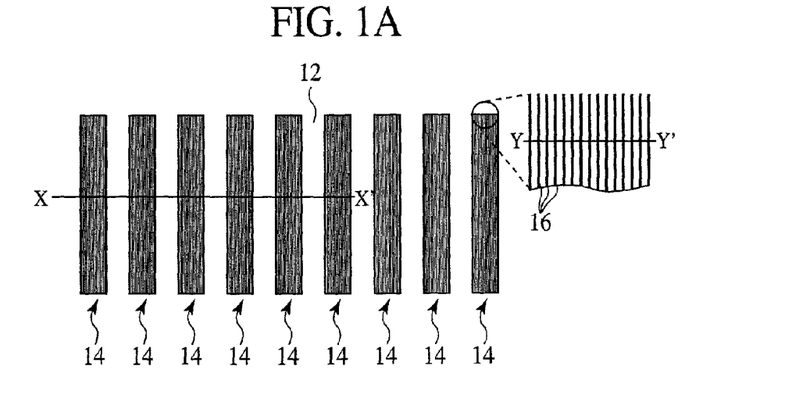
FIGS. 1A-1C are diagrammatic views of alignment marks of the semiconductor device according to a first embodiment of the present invention, which show a structure of the alignment marks.
Figure 1B:
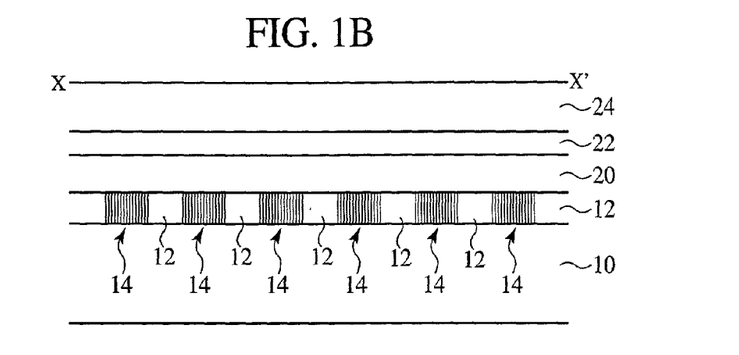
Figure 1C:
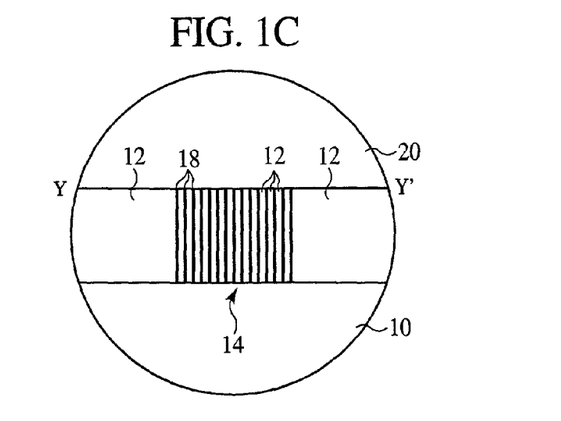
Figure 2:
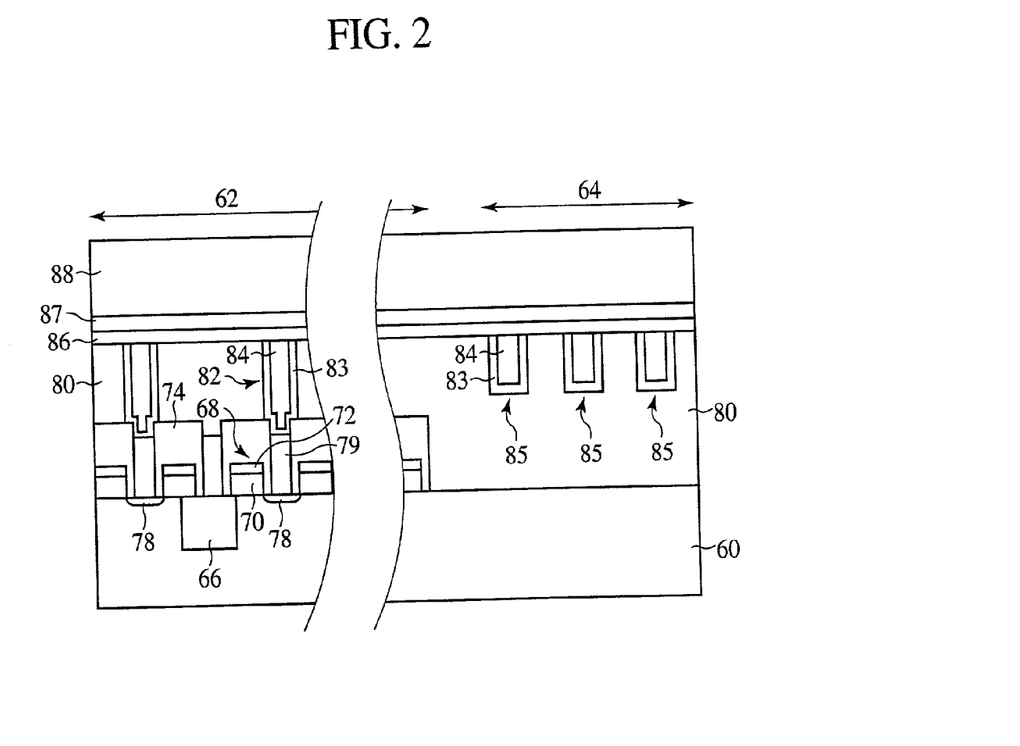
FIG. 2 is a sectional view of the semiconductor device according to the first embodiment of the present invention, which shows a structure thereof.
Figure 3:
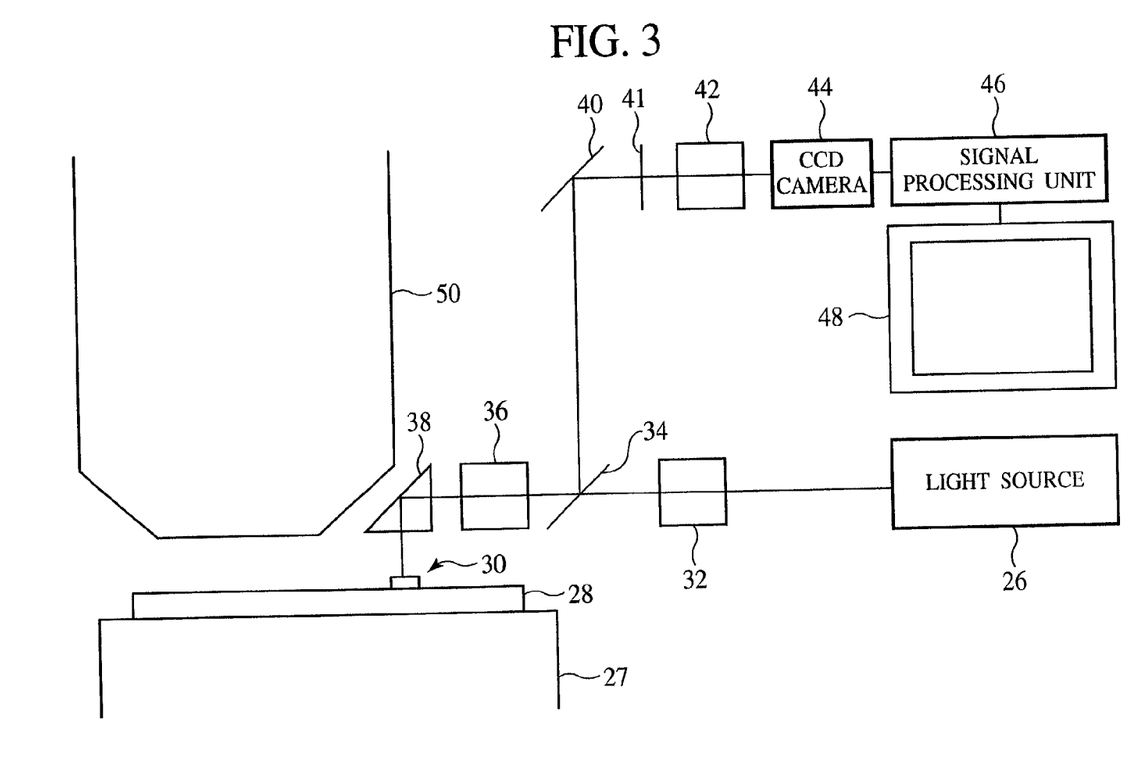
FIG. 3 is a block diagram of the alignment sensor, which shows a structure thereof.
Figure 4:
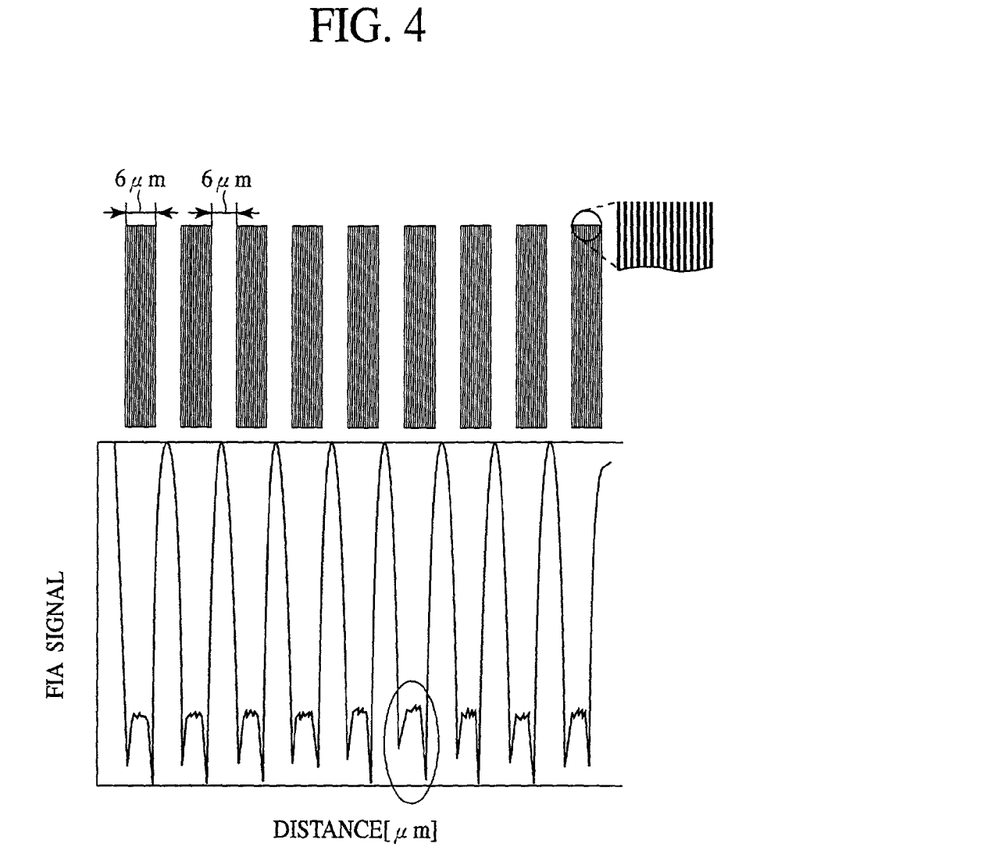
FIG. 4 is a graph of one example of FIA signals of the alignment marks of the semiconductor device according to the first embodiment of the present invention.

The semiconductor device and an alignment sensing method for the semiconductor device according to a first embodiment will be explained with reference to FIGS. 1A-1C, 2, 3, and 4. FIGS. 1A-1C are diagrammatic views of alignment marks of the semiconductor device according to the first embodiment, which show a structure of the alignment marks. FIG. 2 is a sectional view of the semiconductor device according to the present embodiment, which shows a structure thereof. FIG. 3 is a diagrammatic view of the alignment sensor, which shows a structure thereof. FIG. 4 is a graph of one example of FIA signals of the alignment marks of the semiconductor device according to the present embodiment.

First, a structure of the alignment marks of the semiconductor device according to the present embodiment will be explained with reference to FIGS. 1A-1C. FIG. 1A is a top view of the alignment marks of the semiconductor device according to the present embodiment. FIG. 1B is the sectional view along the line X-X' in FIG. 1A. FIG. 1C is the sectional view of the enlarged portion in FIG. 1A along the line Y-Y'.

As shown in FIGS. 1A and 1B, alignment marks 14 in the shape of strips each of, a 6 µm width and a 70 µm length are provided side by side at a 12 µm pitch in a 250 nm thickness silicon oxide film 12 formed on a silicon wafer 10. Each alignment mark 14 is formed of a plurality of 0.2 µm width and 70 µm length grooves juxtaposed at a 0.4 µm pitch. As shown in FIG. 1C, amorphous silicon film 18 is buried in the grooves 16. Thus, the alignment marks 14 are formed by a line and space (L/S) pattern.

The thus-formed alignment marks 14 are usually formed on a scribe line outside an element region formed on the silicon wafer 10.

In FIG. 1B, a silicon oxide film 20 of, e.g., a 200 nm thickness is formed on the upper surface of the above-described structure by a later semiconductor device fabrication step. On the silicon oxide film 20, a BARC 22 of, e.g., AR5 (Tradename, by Shipley Corporation) is formed in a 95 nm thickness for further lithography. A resist film 24 is formed thereon in a 470 nm thickness.

Then, a structure of the semiconductor device according to the present embodiment having the above-described alignment marks 14 will be explained with reference to FIG. 2. The semiconductor device shown in FIG. 2 is a DRAM. Memory cells of the element regions and the alignment marks 14 are concurrently formed.

Memory cell regions 62 for memory cells of the DRAM to be formed in, and mark regions 64 for the alignment marks 14 to be formed in are provided on a silicon substrate 60.

In the memory cell region, element isolation regions 66 of a 200 nm thickness silicon oxide film are formed, and transfer transistors are formed in the element regions defined by the element isolation regions 66.

Each transfer transistor comprises a gate electrode 68 of the polycide structure of the layer film of a 70 nm thickness amorphous silicon film 70 and a 200 nm thickness tungsten film 72, and a source drain diffused layer 78 formed by self-alignment with the gate electrode 68. A silicon nitride film 74 is formed on the upper surface and the side surface of the gate electrode 68. A plug 79 of amorphous silicon film is buried between the gate electrode 68 covered with the silicon nitride film 74, connected to the source/drain diffused layer 78.

An inter-layer insulation film 80 of a 320 nm thickness silicon oxide film is formed on the silicon substrate 60 with the transfer transistors formed on.

Plugs 82 of a layer film of a titanium nitride film 83 and a tungsten film 84 are buried in the inter-layer insulation film 80 of the memory cell region 62, connected to the plugs 79.

Grooves 85 forming the L/S pattern of the alignment marks are formed in the inter-layer insulation film 80 of the mark region 64. The grooves 85 are filled with the titanium nitride film 83 and the tungsten film 84 formed at the time of forming the plugs 82 of the DRAM. A pattern forming margin of the grooves 85 is larger than a cell pattern of the memories to be formed in the memory cell region 62.

A 50 nm thickness amorphous silicon film 86 is formed on the entire surface of the memory cell region 62 and the mark region 64 of the above-described structure. A 600 nm thickness BARC 87 and a 400 nm thickness resist film 88 are sequentially formed on the amorphous silicon film 86. The resist film 88 is for patterning the amorphous silicon film 86 into storage electrodes connected to the plugs 82. In this state, alignment is made by an aligner, such as a stepper, a scanner or others, and the resist film 88 is exposed.

Then, an alignment sensor of FIA of the aligner used in the lithography step, which senses alignment of the alignment marks of the semiconductor device according to the present embodiment will be explained.

As shown in FIG. 3, the alignment sensor comprises a light source 26 for applying illumination to alignment marks 30 formed on a wafer 28 mounted on a stage 27 of the aligner. Between the light source 26 and the wafer 28 there are disposed, from the side of the light source 26, a groups of irradiation lenses 32, for making the illumination from the light source 26 into parallel rays, a beam splitter 34 for splitting light reflected back on the alignment marks 30, a groups of objectives 36, and a prism 38 for applying the illumination which has passed the group of objectives 36 vertically to the wafer 28. On the side to which the beam splitter 34 splits the reflected light from the wafer 28, there is disposed a CCD camera 44 for converting FIA signals, electric signals, of received light through an index mark 41 and a group of oculars 42. The CCD camera 44 is connected to a signal processing unit 46 for signal processing the signals obtained by the CCD camera 44 to sense alignment of the alignment marks 30. The signal processing unit 46 is connected to a monitor 48 for displaying waveforms of the FIA signal obtained by the CCD camera 44.

In FIG. 3, a reduction projection lens 50 of the aligner, which reduces and projects a pattern of the reticle in the exposure of the lithography step is disposed near a region where a device pattern of the wafer 28 is to be formed.

Illumination emitted by the light source 26 is led to the group of irradiation lenses 32. The group of irradiation lenses 32 comprises one or a plurality of lenses and transfers the illumination from the light source 26 into parallel rays.

The illumination which has passed the group of irradiation lenses 32 passes through the beam splitter 34. The illumination which has passed the beam splitter 34 is applied vertically to the wafer 28 on the stage 27 through the group of objectives 36 comprising one or a plurality of lenses, and the prism 38.

Light reflected on the alignment marks 30 of the wafer 28 passes through the group of objectives 36 through the prism 38, is reflected on the beam splitter 34 and let to the reflection mirror 40. Light reflected on the beam splitter 34 passes sequentially through the index mark 41 and the group of oculars 42 through the reflection mirror 40, and forms an image on the CCD elements of the CCD camera 44.

The CCD camera 44 converts light it has received to FIA signals, which are electric signals, and outputs the FIA signals to the signal processing unit 46. The signal processing unit 46 makes signal processing on the FIA signals supplied by the CCD camera 44 to detect alignment of the respective alignment marks 30.

Based on thus sensed alignment information, the stage 27 of the aligner is driven, and the wafer 28 is aligned.

The semiconductor device according to the present embodiment is characterized by the alignment marks 14 which are divided by the L/S pattern formed by a plurality of grooves 16 of a size smaller than a resolution limit of the above-described aligner. Because of this characteristic, image information, such as noises, etc. in the region inside the alignment mark 14 can be ignored. Furthermore, because of the divided alignment marks 14, the region inside the alignment marks 14 looks substantially darker in comparison with the surroundings, which produces higher contrast. Thus, the alignment accuracy of the lithography step can be improved.

FIG. 4 is a graph of one example of waveforms of the FIA signals of the alignment marks 14 shown in FIG. 1. As shown, in comparison with the conventional alignment marks 104 shown in FIG. 9, the edges of the alignment marks 14 are not emphasized, and waveforms of FIA signals having very high contrast between the alignment marks 14 and the rest region can be obtained. The double edge circled in the graph is made smaller in comparison with that of the conventional alignment mark shown in FIG. 9.

A width, a pitch, etc. of the grooves 16 forming the L/S pattern of the alignment marks 14 of the semiconductor device according to the present embodiment are changed to thereby adjust waveforms of the FIA signals. This makes it possible to perform alignment in the lithography step, based on optimum waveforms of FIA signals, with higher accuracy.

For the purpose of confirming improvement of the alignment accuracy by the use of the alignment marks 14 of the semiconductor device according to the present embodiment, the alignment was performed by EGA (Enhanced Global Alignment), and a residual after the EGA was computed. The EGA residual means an error $3\sigma$ given by subtracting a line component from EGA. Residuals were computed respectively on 9 sheets of wafers, and then average values of the residuals, and errors $3\sigma$ of the 9 sheets of wafers were computed. The average values were 15 nm and 13 nm respectively in the X direction and in the Y direction. The errors $3\sigma$ were 16 nm and 22 nm respectively in the X direction and the Y direction.

Here, an average value indicates an average value of EGA residuals among wafers and reflects absolute accuracy of the EGA. $3\sigma$ indicates dispersion of EGA residuals among wafers and reflects reproduction accuracy of EGA accuracy.

Based on the above-described result, it was confirmed that when the alignment marks 14 of the semiconductor device according to the present embodiment, the absolute accuracy of EGA is improved, and alignment of high accuracy can be stably realized among wafers.

As described above, according to the present embodiment, alignment marks are divided by the L/S pattern formed by a plurality of grooves having a size smaller than a resolution limit of the alignment sensor and having a pattern margin larger than a device pattern formed on a wafer, whereby influences of WIS and TIS can be depressed, and FIA signal waveforms having little deformation can be obtained. Based on thus obtained FIA signals, wafers are aligned, whereby high alignment accuracy can be improved.

In the present embodiment, as a structure of the semiconductor device, the structure of the DRAM and the alignment marks shown in FIG. 2 has been explained, but the semiconductor device and the alignment marks are not limited to the above-described structure. For example, the semiconductor device may have the structure of DRAM and alignment marks shown in FIG. 5.

Figure 5:
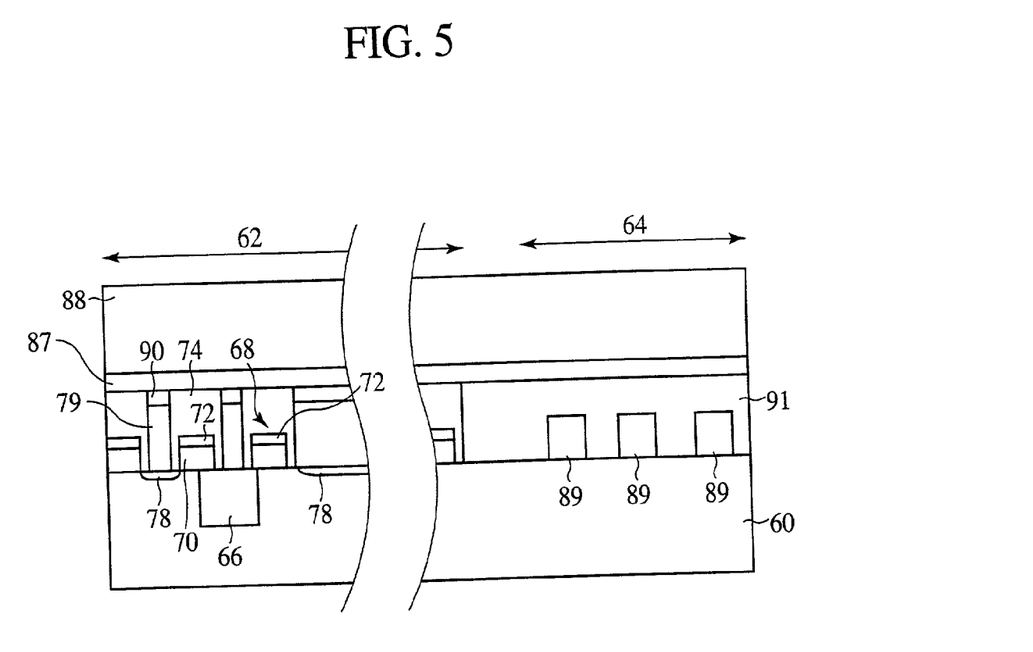
FIG. 5 is a sectional view of a modification of the structure of the semiconductor device according to the first embodiment of the present invention.

As shown in FIG. 5, on a silicon substrate 60, a memory cell region 62 for the memory cells of the DRAM to be formed in and a mark region 64 for the alignment marks to be formed in are provided.

In the memory cell region, element isolation regions 66 of a 200 nm thickness silicon oxide film are formed, and transfer transistors are formed in the element regions defined by the element isolation regions 66.

Each transfer transistor comprises a gate electrode 68 of the polycide structure of the layer film of a 70 nm thickness amorphous silicon film 70 and a 200 nm thickness tungsten film 72, and a source drain diffused layer 78 formed by self-alignment with the gate electrode 68. A silicon nitride film 74 is formed on the upper surface and the side surface of the gate electrode 68. A plug 79 of amorphous silicon film is buried between the gate electrode 68 covered with the silicon nitride film 74, connected to the source/drain diffused layer 78. A silicon oxide film 90 is formed on the plug 79.

On the silicon substrate 60 in the alignment mark region 64, projections 89 of an amorphous silicon film, which form an L/S pattern of the alignment marks are formed. A silicon oxide film 91 is formed on the entire surface.

A 60 nm thickness BARC 87 and a 400 nm thickness resist film 88 for patterning a memory cell structure of the DRAM are sequentially formed on the entire surface of the memory cell region 62 and the alignment mark region 64 of the above-described structure.

Thus, the L/S pattern shown in FIG. 2, which is formed by the grooves 85, may be formed by the projections 89.

A Second Embodiment

Figure 6A:
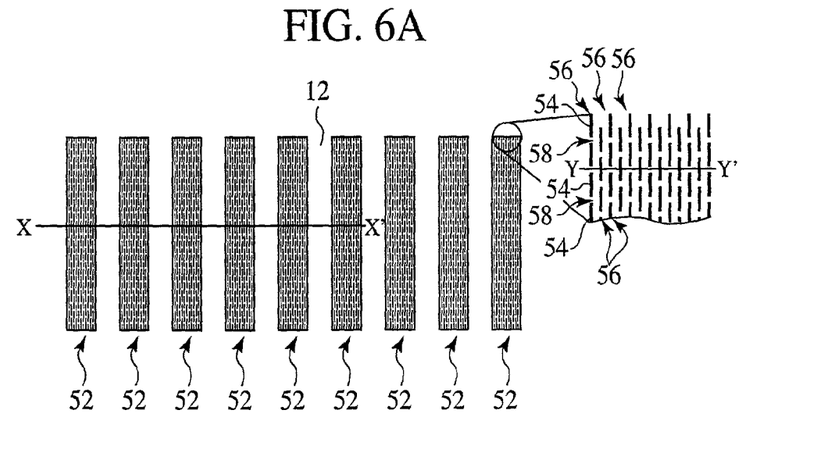
FIGS. 6A-6C are diagrammatic views of alignment marks of the semiconductor device according to a second embodiment of the present invention, which shows a structure of the alignment marks.
Figure 6B:
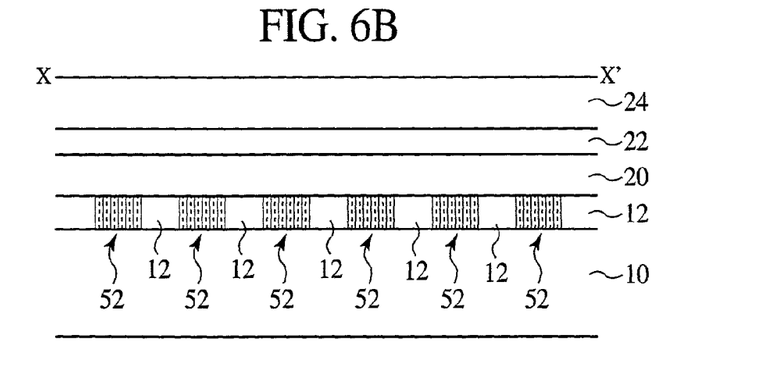
Figure 6C:
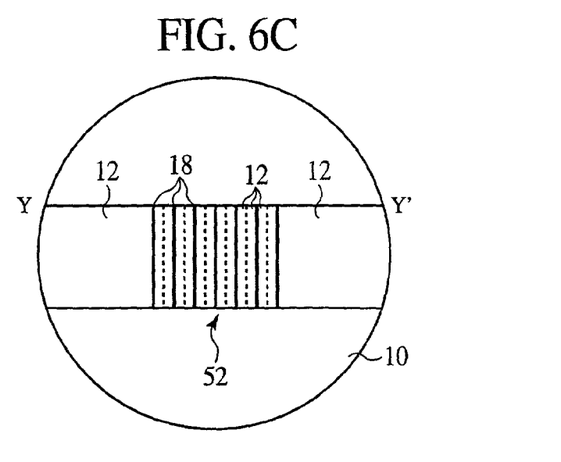
Figure 7:
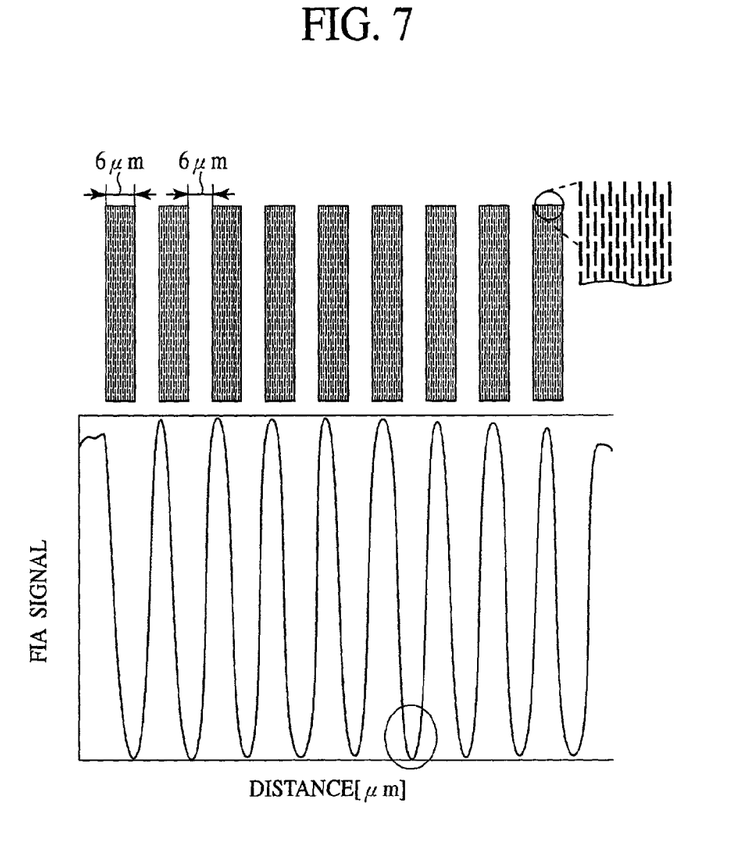
FIG. 7 is a graph of one example of FIA signals of the alignment marks of the semiconductor device according to the second embodiment of the present invention.

The semiconductor device and the alignment sensing method according to a second embodiment of the present invention will be explained with reference to FIGS. 6A-6C and 7. FIGS. 6A-6C are diagrammatic views of alignment marks of the semiconductor device according to the present embodiment, which show a structure thereof. FIG. 7 is a graph of one example of FIA signals of the alignment marks of the semiconductor device according to the present embodiment. The same members of the present embodiment as those of the semiconductor device according to the first embodiment are represented by the same reference numbers not to repeat or to simplify their explanation.

It can be suppressed by dividing alignment marks to be near a size of a device pattern formed on a wafer that alignment marks are deformed to be unsymmetrical due to dishing or other causes in the conventional CMP step.

Alignment marks, which are positioned generally on scribe lines at an outer periphery of chips formed on a semiconductor wafer, are very susceptible to aberrations of an aligner. In order to divide alignment marks in a suitable size, suitable OPC (Optical Proximity Correction), and pattern correction and assistance, as of auxiliary patterns, are essential. Exposure conditions of the aligner are usually optimized for a device pattern, which makes it very difficult to ensure a common margin for a micronized pattern as alignment marks on a scribe line and a device pattern.

Accordingly, in order to raise accuracy of the alignment by making a division size of the alignment marks small, it is necessary to carefully monitor a pattern forming margin, pattern defects, etc. even on the scribe line, on which accuracy of forming a pattern can be intrinsically ignored to maximum. Such careful monitoring may lead to low product yields.

The semiconductor device according to the present embodiment increases the alignment accuracy without causing the above-described problems, by further dividing the alignment patterns of the semiconductor device according to the first embodiment.

First, a structure of the alignment marks of the semiconductor device according to the present embodiment will be explained with reference to FIG. 6. FIG. 6A is a top view of the alignment marks, which show the structure thereof. FIG. 6B is the sectional view along the line X-X' in FIG. 6A. FIG. 6C is the sectional view along the line Y-Y' in FIG. 6A.

As shown in FIGS. 6A and 6B, strip-shaped alignment marks 62 of, e.g., a 6 μm width and a 70 μm length are juxtaposed with each other at a 12 μm pitch in a 250 nm thickness silicon oxide film 12 formed on a silicon wafer 10.

In each alignment mark 52, cavities 54 each of a 0.2 μm width and a 1.5 μm length are provided straight longitudinally of the alignment mark 52 at a 0.5 μm-pitch to form a broken-line pattern 56. The broken-line patterns 56 are longitudinally arranged side by side at a 0.4 μm pitch in each alignment mark 52. As shown in FIG. 6C, an amorphous silicon film 18 is buried in the cavities 54.

As shown in FIG. 6A, intervals 58 between the cavities 54 of one broken-line pattern 56 are offset from those 58 between the cavities 54 of an adjacent broken-line pattern 56. Thus, the alignment marks 52 are the L/S patterns of the first embodiment which are two-dimensionally divided.

The thus formed alignment marks 52 of the semiconductor device according to the present embodiment are usually formed on a scribe line at an outer periphery of chips formed on the silicon wafer 10.

In FIG. 6B, a silicon oxide film 20 of, e.g., a 200 nm thickness is formed on the upper surface of the above-described structure by a later semiconductor device fabrication step. On the silicon oxide film 20, a BARC 22 is formed in a 95 nm thickness for further lithography. A resist film 24 is formed thereon in a 470 nm thickness.

The structure of the semiconductor device according to the present embodiment as well as the first embodiment may be a DRAM and can have the alignment marks 52 as shown in FIGS. 2 and 5.

As described above, the semiconductor device according to the present embodiment is characterized by the alignment marks 52 given by two-dimensionally dividing the L/S patterns of the alignment marks 14 of the first embodiment. The L/S patterns having a size smaller than a resolution limit of the alignment sensor and having a pattern forming margin larger than a device pattern formed on a wafer are two-dimensionally divided, whereby the resolution of the alignment sensor is inevitably insufficient, and FIA signals having higher contrast and little deformations can be obtained. The L/S patterns having a pattern forming margin larger than a device pattern formed on a wafer is divided into the patterns of the alignment marks 52, whereby it is not necessary to carefully monitor pattern defects, etc. on a scribe line where the alignment marks 52 are formed.

FIG. 7 is a graph of one example of waveforms of FIA signals of the alignment marks 52 shown in FIGS. 6A-6C. As shown, in comparison with the first embodiment, waveforms of the FIA signals having higher contrast and little deformation could be obtained. As circled in the graph, any double-edge is not present.

As in the first embodiment, for the purpose of confirming improvement of the alignment accuracy by the use of the alignment marks 14 of the semiconductor device according to the present embodiment, the alignment was performed by EGA (Enhanced Global Alignment), and a residual after the EGA was computed. Residuals were computed respectively on 9 sheets of wafers, and then average values of the residuals and the residuals 3σ of the 9 sheets of wafers were computed. The average values were 12 nm both in the X direction and in the Y direction. The residuals 3σ were 12 nm and 10 nm respectively in the X direction and the Y direction.

Based on the above result, it was confirmed that the use of the alignment marks 52 of the semiconductor device according to the present embodiment can improve absolute accuracy of EGA further in comparison with those of the first embodiment, and alignment of high accuracy among wafers can be stably realized.

Furthermore, the semiconductor device according to the present embodiment is characterized in that the alignment marks 52 are formed by suitably changing a length or an interval for dividing the L/S patterns of the alignment marks 14 of the first embodiment, or a duty ratio of divided patterns, whereby waveforms of FIA signals can be adjusted. The adjustment of waveforms of FIA signals by changing the division of the patterns will be explained below.

Figure 8A:
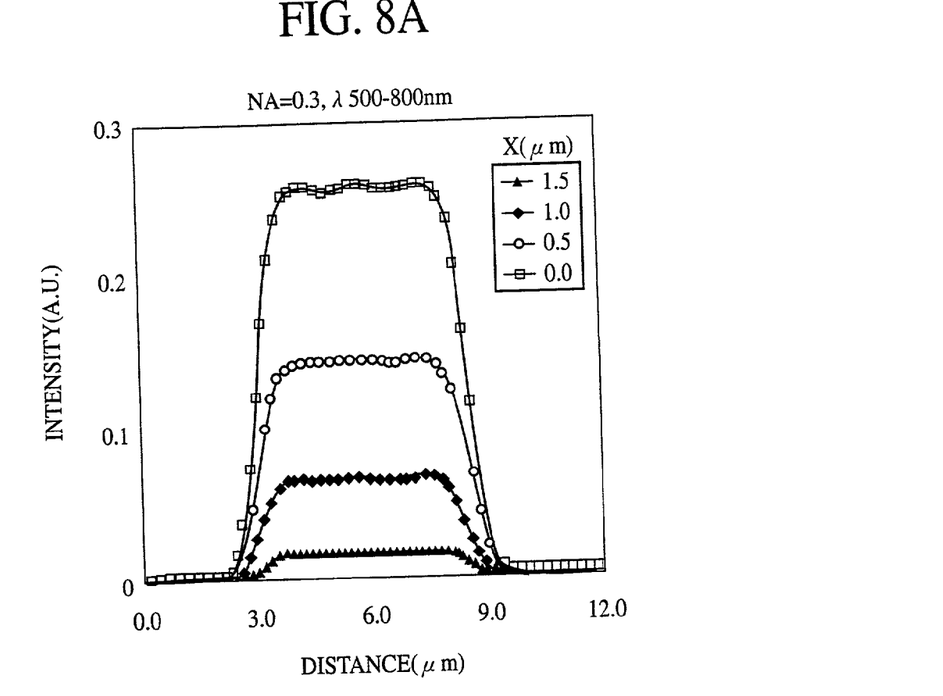
FIG. 8A is a graph of results of simulation of relationships between a pattern division of the alignment marks of the semiconductor device according to the second embodiment of the present invention, and FIA signals.
Figure 8B:
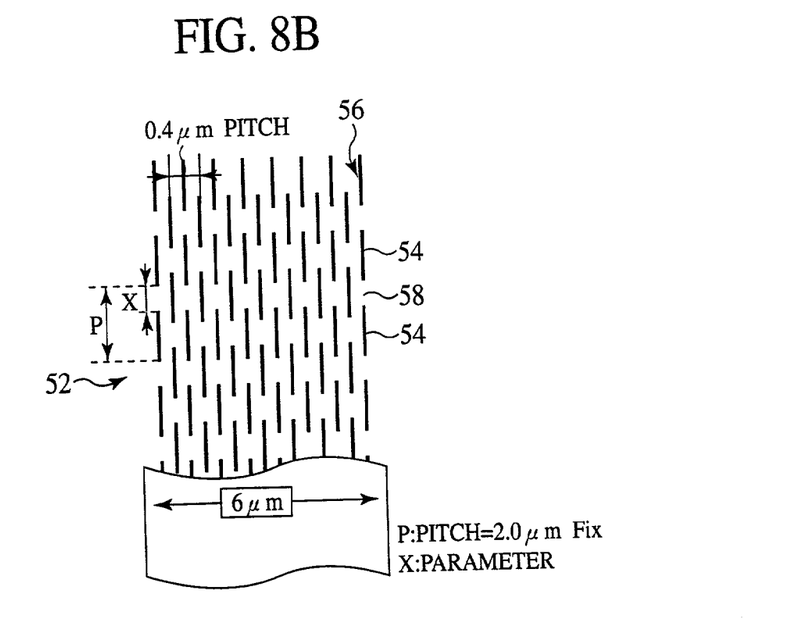
FIG. 8B is a top view of the alignment marks used in the simulation with the parameters of the pattern division.

FIG. 8A is a graph of results of simulation of relationships between division pitches of the L/S patterns of the alignment marks 52 and waveforms of FIA signals. In the simulation, as shown in FIG. 8B, luminous intensities were computed with the L/S patterns having a 0.4 µm pitch divided fixedly at a 2.0 µm pitch and at different division intervals X.

As apparent in FIG. 8A, in comparison with the case that the lines are not divided, as the interval X of the lines is increased, smooth waveforms having the edges of the alignment marks 52 not emphasized are obtained.

As described above, a divided state of the patterns of the alignment marks 52 is changed, whereby deformations, etc. are removed from waveforms of FIA signals to adjust the waveforms to be required waveforms. Based on FIA signals having the waveforms thus adjusted, wafers can be aligned with higher accuracy.

As described above, according to the present embodiment, the L/S patterns having a size smaller than a resolution limit of the alignment sensor and having a pattern forming margin larger than a device pattern to be formed on a wafer are two-dimensionally divided, whereby the alignment sensor has inevitably insufficient resolution, which makes it possible to suppress the influence of WIS and TIS, and to obtain FIA signals having high contrast and little deformation. A division length and interval of the L/S patterns of the alignment marks are changed to thereby adjust waveforms of FIA signals. Based on the thus-obtained FIA signals, wafers are aligned to thereby improve alignment accuracy.

[Modifications]

The present invention is not limited to the above-described embodiments.

In the above-described embodiments, the alignment marks are divided in L/S patterns, and the respective lines of the L/S patterns are divided at a required interval and pitch. A division interval, a pitch, a size, etc. can be suitably changed in accordance with a size of a device to be formed on a wafer with the alignment marks formed on, and achievements of the optical system, etc. of an optical system used.

Micronized patterns for dividing the alignment marks are not limited to the line and space patterns of the above-described embodiments, and can be any pattern, such as dot-patterns, lattice-pattern, or others, as long as the pattern is micronized.

It is preferable that the micronized pattern is formed substantially uniformly in the alignment patterns, but the micronized pattern may not be formed uniform.

In the above-described embodiments, the structures of the semiconductor device have been explained by means of DRAMs, but the structure of the semiconductor device is not limited to DRAM. The present invention is applicable to any other semiconductor device.

In the above-described embodiments, an interval, etc. for dividing the alignment marks are changed to thereby adjust waveforms of FIA signals. Waveforms of FIA signals can be adjusted also by changing irradiation conditions for the illumination of the alignment sensor and/or imaging conditions for the reflected light. For example, numerical apertures of the optical system, as of the group of irradiation lenses 32, the group of objectives 42, the group of oculars 36, etc., are changed to thereby adjust waveforms of FIA signals. Coherency of the illumination from the light source 26 is changed to thereby adjust waveforms of FIA signals.

What is claimed is:

1. A semiconductor device comprising a plurality of alignment marks formed over a semiconductor wafer,
   each of the alignment marks being divided by a micronized line-and-space pattern into a plurality of lines extending along a first direction,
   each of the plural lines being divided in a broken line having a plurality of segments which are arranged in the first direction only, the plurality of segments of the lines being positioned offset in the first direction from the plurality of segments of their adjacent lines,
   wherein all of the alignment marks formed in an entire alignment mark area have a same shape so as to generate about a same field image alignment signal.

2. A semiconductor device according to claim 1, wherein a margin in which the micronized pattern is formed is larger than a margin for a memory cell pattern to be formed on the semiconductor wafer.

* * * * *